US009257221B2

(12) United States Patent
Liu et al.

(10) Patent No.: US 9,257,221 B2
(45) Date of Patent: Feb. 9, 2016

(54) THROUGH-HOLE VIA INDUCTOR IN A HIGH-FREQUENCY DEVICE

(75) Inventors: Chen-Chung Liu, Hsinchu (TW); Ian-Chun Cheng, Miaoli County (TW)

(73) Assignee: CYNTEC CO., Ltd., Hsinchu (TW)

( * ) Notice: Subject to any disclaimer, the term of this patent is extended or adjusted under 35 U.S.C. 154(b) by 349 days.

(21) Appl. No.: 13/570,267

(22) Filed: Aug. 9, 2012

(65) Prior Publication Data

US 2013/0271240 A1 Oct. 17, 2013

Related U.S. Application Data

(60) Provisional application No. 61/623,566, filed on Apr. 13, 2012.

(51) Int. Cl.

| | |
|---|---|
| ***H03H 7/01*** | (2006.01) |
| ***H05K 1/16*** | (2006.01) |
| ***H05K 13/00*** | (2006.01) |
| ***H01F 17/00*** | (2006.01) |
| ***H01F 19/04*** | (2006.01) |

(52) U.S. Cl.
CPC ............ *H01F 17/0013* (2013.01); *H01F 19/04* (2013.01); *H01F 2017/002* (2013.01); *Y10T 29/49117* (2015.01)

(58) Field of Classification Search
CPC H01F 17/0013; H01F 19/04; H01F 2017/002
USPC .......................................................... 174/250
See application file for complete search history.

(56) References Cited

U.S. PATENT DOCUMENTS

| | | | | |
|---|---|---|---|---|
| 5,451,917 | A * | 9/1995 | Yamamoto | H01P 1/2039 333/204 |
| 7,170,384 | B2 * | 1/2007 | Kim | H01F 17/0006 336/200 |
| 7,388,462 | B2 * | 6/2008 | Ahn | H01F 17/0033 257/E27.046 |
| 8,207,811 | B2 * | 6/2012 | Mano | H01F 17/0006 336/200 |
| 2003/0020656 | A1 * | 1/2003 | Shor | H01Q 5/00 343/700 MS |
| 2004/0160721 | A1 * | 8/2004 | Barr | H05K 1/115 361/104 |
| 2013/0027127 | A1 * | 1/2013 | Topaloglu | 327/564 |

* cited by examiner

*Primary Examiner* — Timothy Thompson
*Assistant Examiner* — Paul McGee, III
(74) *Attorney, Agent, or Firm* — Min-Lee Teng; Litron Patent and Trademark Office

(57) ABSTRACT

The invention discloses a high-frequency device having a through-hole via inductor in a substrate. The through-hole via inductor has an integral body. The inductance of the through-hole via inductor is greater than that of the horizontal inductor. The through-hole via inductor comprises at least two materials, wherein one of said at least two materials is a conductive material. The present invention also discloses a method for manufacturing the structure of the high-frequency device, wherein the method mainly includes via-drilling and via-filling in the substrate, and lithography process on the substrate.

20 Claims, 10 Drawing Sheets

THROUGH-HOLE VIA INDUCTOR IN A HIGH-FREQUENCY DEVICE

CROSS REFERENCE TO RELATED APPLICATIONS

This application claims the benefit of priority of U.S. Provisional Application No. 61/623,566, filed Apr. 13, 2012, and titled "A Through-Hole Via Inductor in a High-Frequency Device", the contents of which are herein incorporated by reference in its entirety.

BACKGROUND OF THE INVENTION

I. Field of the Invention

The present invention relates to an inductor in a circuit structure of a high-frequency device and, in particular, to a through-hole via inductor in a circuit structure of a high-frequency device.

II. Description of the Prior Art

Recently, the portable electronic and mobile communication products gradually become lighter, thinner, small-sized, multi-functional, reliable and cheaper. There is a tendency to develop high-density devices. The active and passive devices have become more small-sized, integrated, on-chip and in-module to reduce the costs and improve the competitiveness of the devices.

There are some technologies, such as MLCC (multi-layer ceramic capacitor), via-drilling and via-filling of a single-layer substrate or lithography process, to shrink the size of a device by maximizing the usage of the space within the device. Conventionally, please refer to FIG. 1, via-drilling and via-filling 2 can be performed in a single-layer ceramic substrate 1. Then, multiple single-layer ceramic substrates 1 can be combined into a multi-layer substrate 3 (by sintering) to form a through-hole via 4 in a multi-layer ceramic substrate. A through-hole via 4 is used to electrically connect two adjacent conductive layers. The above-mentioned through-hole via is only used for an electrical connection between different layers, and the space of the through-hole via will require a larger substrate for accommodating it. Therefore, what is needed is a solution to fully utilize the space of a through-hole via to further shrink the size of a device and to achieve better electrical performance of the device.

SUMMARY OF THE INVENTION

One objective of the present invention is that a conductive material in a through-hole via is used as a through-hole via inductor (maybe called vertical inductor) for some high-frequency devices, such as a high-frequency filter. The present invention regards the conductive material in the through-hole via in the substrate as a main inductor (named through-hole via inductor hereafter). For high-frequency application above 1 G Hz, preferably 2.4 G Hz, and the conductive material in the through-hole via can be used as a main inductor component to achieve a better Q value of the high-frequency device. In one embodiment, the inductance of the through-hole via inductor is greater than that of the horizontal inductor on the substrate. In addition, it can greatly shrink the size of the high-frequency device.

In one embodiment, the through-hole via inductor can comprise at least two materials which are well designed in the through-hole via inductor to achieve the above electrical characteristics, wherein one of said at least two materials is a conductive material. In one embodiment, the through-hole via inductor can be made of at least two conductive materials.

In another embodiment, the through-hole via inductor includes a conductive material and a non-conductive material which is enclosed by the conductive material. Therefore, it can greatly improve the electrical performance of the high-frequency device.

The invention also discloses a U-shape through-hole via inductor which is used in a high-frequency device and made of a first through-hole via inductor in the substrate, a second through-hole via inductor in the substrate and a horizontal inductor disposed on the substrate. In a high-frequency operating condition, such as 2.4 G Hz, the combination of the first through-hole via inductor and the second through-hole via inductor in the substrate can be used as main component to achieve a better Q value. In addition, it can greatly shrink the size of the high-frequency filter.

In the preferred embodiment in the present invention, the structure of a high-frequency device, such as a high-frequency filter, is provided. The structure mainly includes a capacitor and a portion of inductor disposed on opposite surfaces of the substrate. The inductor can be a through-hole via inductor or a U-shape through-hole inductor.

One objective of the present invention discloses a method for manufacturing the structure of the through-hole via inductor. The process flow comprises two main steps: provide a substrate comprising a through-hole therein; and form a through-hole via inductor in the through-hole of the substrate.

One objective of the present invention also discloses a method for manufacturing the structure of the high-frequency device. The process flow comprises three main steps: form a through-hole via inductor in the substrate; form a horizontal inductor on the top surface of the substrate; and form a horizontal capacitor on the bottom surface of the substrate. The process mainly includes via-drilling and via-filling in the substrate, and lithography process on the substrate.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description and they are not intended to limit the scope of the present invention.

The invention discloses that a conductive material in a through-hole via is used as an inductor (maybe called vertical inductor) for some high-frequency devices, such as a high-frequency filter. A through-hole via is used to electrically connect two adjacent conductive layers between which there is an insulating layer. In the process, the patterned conductive layer on the substrate and a through-hole in the substrate is made of the conductive material, and a through-hole via is filled with a small portion of the conductive material. Compared with the inductor made of a patterned conductive layer on the substrate, the inductor which is made of a small portion of the conductive material in the through-hole can be often ignored. In the present invention, it regards the conductive material in the through-hole in the substrate as a main inductor (named a through-hole via inductor hereafter), which can be often used in some high-frequency devices, such as a high-frequency filter. In high-frequency operational environment (operated at not less than 1 GHz, preferably substantially at 2.4 GHz), the inductance of the conductive material in the through-hole will play an important role. For example, it can have a better Q value. The inductance of the through-hole via inductor can be computed by the simulation software to determine better electrical performance. Therefore, it can make conductive wires in circuit shorter, make the size of high-frequency device smaller and make electrical performance better.

Two terminals of the through-hole via inductor can be electrically connected to any other conductive element. In one example, one terminal can be electrically connected to a capacitor and the other terminal can be electrically connected to an inductor. In another example, one terminal can be electrically connected to a capacitor and the other terminal can be electrically connected to ground.

Figure 1:
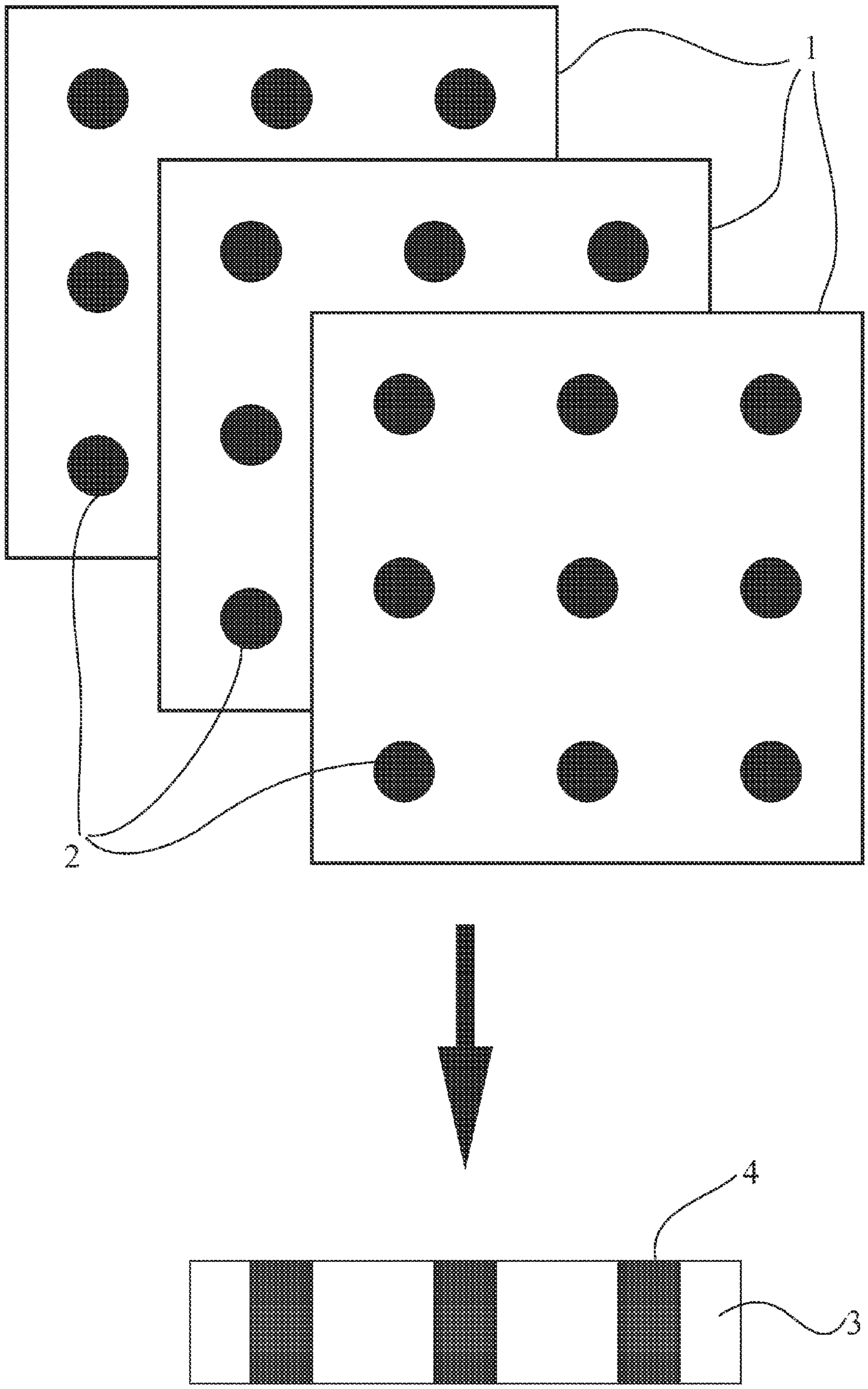
FIG. 1 illustrates a through-hole via in multi-layer substrate (by sintering).
Figure 2A:
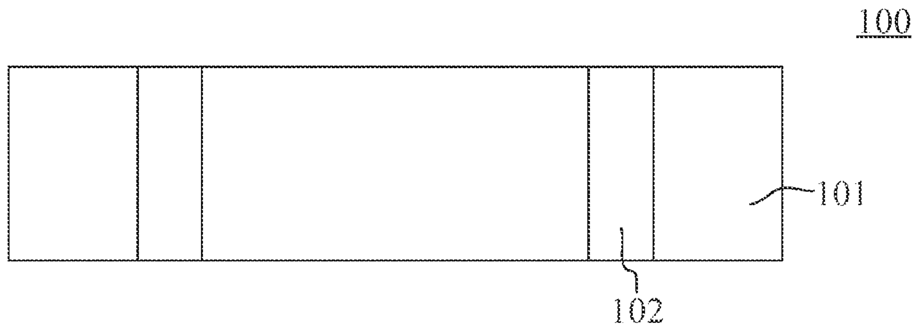
FIG. 2A illustrates a schematic cross-sectional view of the structure of the through-hole via inductor.
Figure 2B:
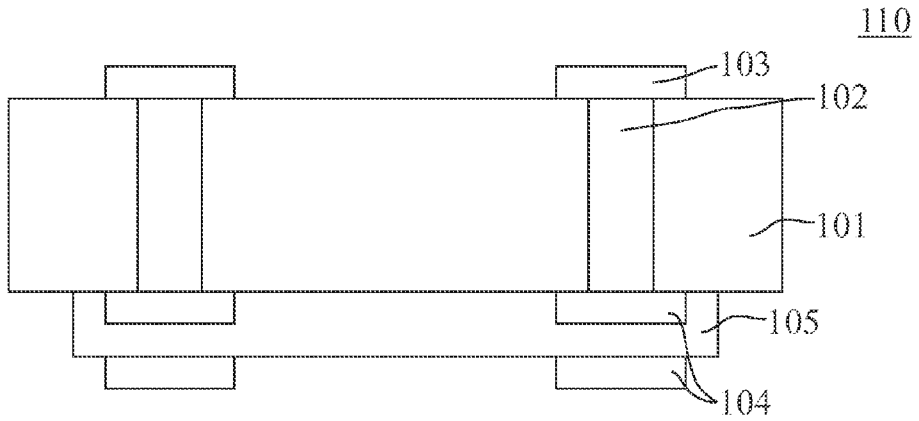
FIG. 2B illustrates a schematic cross-sectional view of the preferred structure made of a through-hole via inductor and a capacitor.

FIG. 2A illustrates a schematic cross-sectional view of the structure 100 of the through-hole via inductor. The structure 100 includes a substrate 101, a through-hole via inductor 102. FIG. 2B illustrates a schematic cross-sectional view of the preferred structure 110 made of a through-hole via inductor and a capacitor. The structure 110 includes a substrate 101, a through-hole via inductor 102, a horizontal inductor 103, a horizontal capacitor 104 and a dielectric layer 105. In the structure 100, 110, the inductance of the through-hole via inductor 102 plays an importance role (more critical than any other horizontal inductor 103) in high-frequency operational environment so that the structure 100, 110 can be applied to some high-frequency devices, such as a high-frequency filter. In one embodiment, the inductance of the through-hole via inductor 102 is greater than that of that horizontal inductor 103. In one embodiment, the resultant inductance of the through-hole via inductor 102 and the horizontal inductor 103 is substantially equal to the inductance of the through-hole via inductor 102. In one embodiment, the through-hole via inductor 102 includes at least two materials which are well designed in the through-hole via inductor 102 to achieve the above electrical characteristics, wherein one of said at least two materials is a conductive material. In one embodiment, the through-hole via inductor 102 has an integral body. The substrate 101 can be made of any suitable material, such as a dielectric substrate or a ceramic substrate (e.g. aluminum-oxide ($Al_2O_3$) substrate). The through-hole via inductor 102 can be made of any suitable material, such as Cu, Ag or a combination thereof. Preferably, the height of the through-hole via inductor 102 is about 320 μm and the width in diameter of the through-hole via inductor is about 100 μm.

Figure 2C:
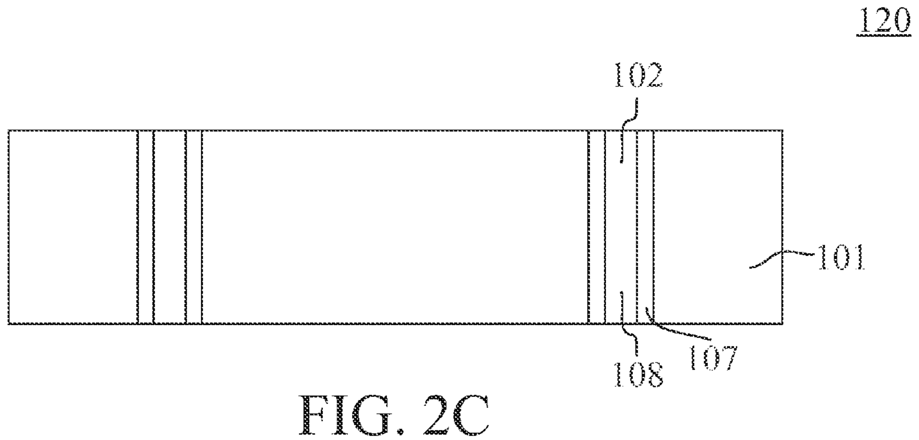
FIG. 2C and FIG. 2D illustrates a schematic cross-sectional view of the structure of the through-hole via inductor made of at least two conductive materials.
Figure 2D:
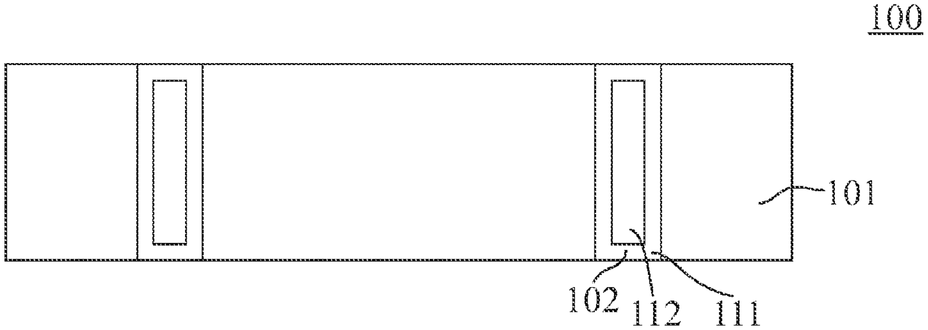

In one embodiment (structure 120), the through-hole via inductor 102 can be made of at least two conductive materials. Please refers to FIG. 2C and FIG. 2D, the through-hole via inductor 102 can be made of a first conductive material 107 overlaying the sidewall of the through-hole and a second conductive material 108 enclosed by the first conductive material 107. The first conductive material 107 can overlay the sidewall of the through-hole by electroplating or any suitable coating process. Preferably, the first conductive material 107 can be made of Cu and the second conductive material 108 can be made of Ag.

In another embodiment, the through-hole via inductor 102 can comprise a conductive material and a non-conductive material enclosed by the conductive material.

The invention also discloses a U-shape through-hole via inductor made of a first through-hole via inductor in the substrate, a second through-hole via inductor in the substrate and a horizontal inductor on the substrate. One terminal of the horizontal inductor can be electrically connected to the first through-hole via inductor and the other terminal of the horizontal inductor can be electrically connected to the second through-hole via inductor. Please refer to FIG. 3A, the structure 200 includes a substrate 201, a horizontal inductor 221, a first through-hole via inductor 202A and a second through-hole via inductor 202B. FIG. 3B illustrates a three-dimensional perspective view of the U-shape through-hole via inductor 250, wherein the substrate 201 is not shown. The U-shape through-hole via inductor 250 is made of the first through-hole via inductor 202A, the second through-hole via inductor 202B and the horizontal inductor 221. In one embodiment, the first through-hole via inductor 202A has a first integral body and the second through-hole via inductor 202B has a second integral body. The equivalent circuit 220 of the U-shape through-hole via inductor 250 is illustrated in FIG. 3C. In one embodiment of the structure 200, the resultant inductance of the first through-hole via inductor 202A and the second through-hole via inductor 202B is greater than the inductance of that horizontal inductor 221. In one embodiment of the structure 200, the resultant inductance of the first through-hole via inductor 202A, the second through-hole via inductor 202B and the horizontal inductor 221 is substantially equal to the resultant inductance of the first through-hole via inductor 202A and the second through-hole via inductor 202B. The structure 200 can be applied to some high-frequency devices, such as a high-frequency filter. Two terminals 222, 223 of the U-shape through-hole via inductor 250 can be electrically connected to any other conductive element. In one example, one terminal 222 can be electrically connected to a capacitor and the other terminal 223 can be electrically connected to an inductor. In another example, one terminal 222 can be electrically connected to a capacitor and the other terminal 223 can be electrically connected to ground. In yet another example, one terminal 222 can be electrically connected to one terminal of a capacitor and the other terminal 223 can be electrically connected to the other terminal of a capacitor. The way to electrically connect any other conductive element can be well designed, and the design layout can be easily modified by skilled persons in the art so that it can't be described in detail herein. According, it can not only shrink the size of the high-frequency device but also improve the electrical performance of the high-frequency device.

The substrate 201 can be made of any suitable material, such as a dielectric substrate or a ceramic substrate (e.g. aluminum-oxide ($Al_2O_3$) substrate). The first through-hole via inductor 202A and the second through-hole via inductor 202B can be made of any suitable material, such as Cu, Ag or a combination thereof. Preferably, the height of each of the first through-hole via inductor 202A and the second through-hole via inductor 202B is about 320 μm, and the diameter of each of the first through-hole via inductor 202A and the second through-hole via inductor 202B is about 100 μm. The above characteristics described in FIG. 2A to FIG. 2D can be applied to the structure 200 in FIG. 3A.

In the preferred embodiment in the present invention, the structure of the high-frequency device, such as a high-frequency filter, is provided. The structure includes a capacitor and a portion of an inductor disposed on opposite surfaces of the substrate.

Figure 3A:
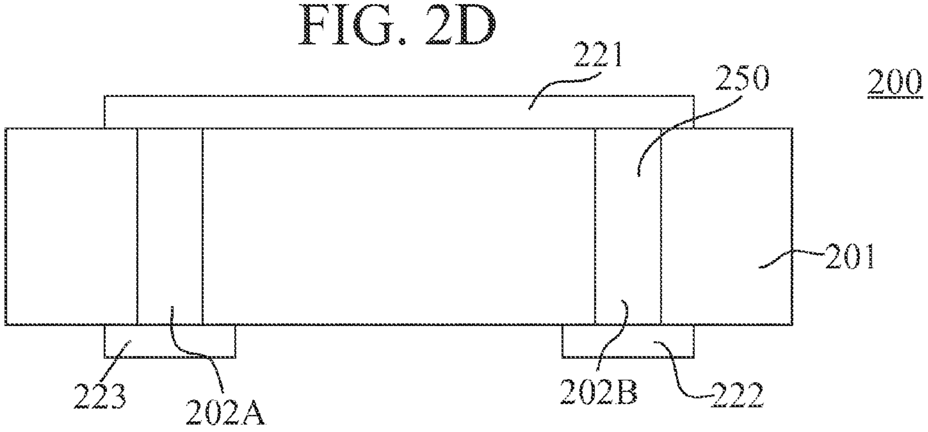
FIG. 3A illustrates a schematic cross-sectional view of the structure of the U-shape through-hole via inductor.
Figure 3B:
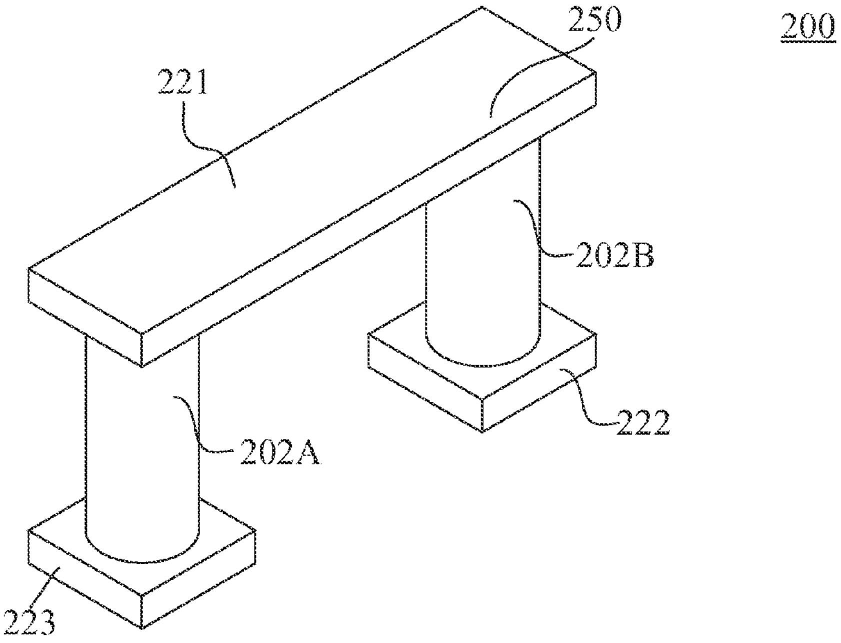
FIG. 3B illustrates a three-dimensional perspective view of the U-shape through-hole via inductor, wherein the substrate is not shown.
Figure 3C:
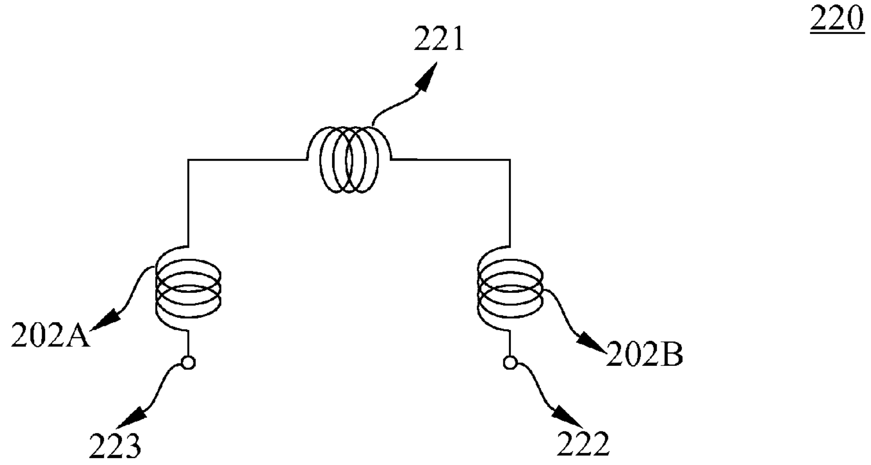
FIG. 3C illustrates an equivalent circuit of the U-shape through-hole via inductor.
Figure 4A:
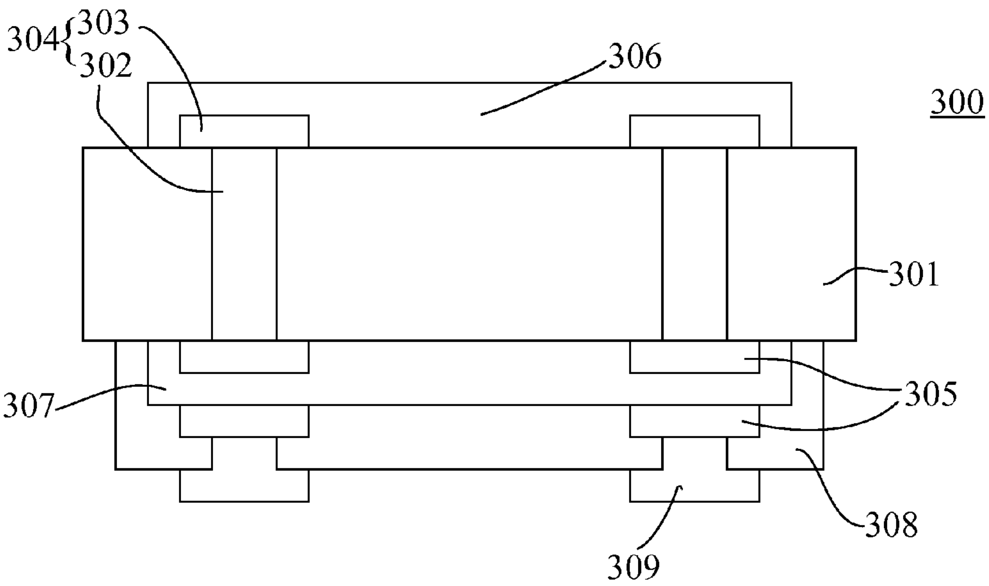
FIG. 4A illustrates a schematic cross-sectional view of the structure of the high-frequency device.

Please refers to FIG. 4A, the structure 300 of the high-frequency device includes a substrate 301, an inductor 304, a capacitor 305, a dielectric layer 307, a first passivation layer 306, a second passivation layer 308 and a contact pad 309. The structure 300 of the high-frequency device mainly includes a capacitor 305 and a portion of an inductor 304 disposed on opposite surfaces of the substrate 301. In particular, the structure 300 of the high-frequency device is mainly made of three parts: a horizontal inductor 303, a through-hole via inductor 302 and a horizontal capacitor (a capacitor) 305, wherein the inductor 304 comprises a horizontal inductor 303 and a through-hole via inductor 302. In one embodiment, the through-hole via inductor 302 has an integral body. In one embodiment, the inductance of the through-hole via inductor 302 is greater than that of that horizontal inductor 303. In one embodiment, the resultant inductance of the through-hole via inductor 302 and the horizontal inductor 303 is substantially equal to the inductance of the through-hole via inductor 302. The above characteristics described in FIG. 2A to FIG. 2D can be also applied to the structure 300 in FIG. 4A. Besides, the U-shape through-hole via inductor 250 previously described in FIG. 3A to FIG. 3C can be also applied to the structure 300 in FIG. 4A.

The substrate 301 can be made of any suitable material, such as a dielectric substrate or a ceramic substrate (e.g. aluminum-oxide ($Al_2O_3$) substrate). The inductor 304 can be made of any suitable material, such as Cu, Ag or a combination thereof. Preferably, the height of the inductor 304 is about 320 μm and the width in diameter of the inductor 304 is about 100 μm. A dielectric layer 307 is between two electrodes of the horizontal capacitor 305. The first passivation layer 306 overlays a horizontal inductor 303 (a portion of the inductor 304), and the second passivation layer 308 overlays the horizontal capacitor 305. A contact pad 309, which is disposed on the horizontal capacitor 305 and electrically connected to the horizontal capacitor 305, is used as an I/O terminal of the structure 300 of the high-frequency device.

In an preferred embodiment in the present invention, the structure 300 of the high-frequency device has a capacitor 305 and a portion of an inductor 304 disposed on opposite surfaces of the substrate 301, wherein the inductor 304 comprises a plurality of U-shape through-hole via inductors 250 which are all connected to the single capacitor 305 disposed on the bottom surface of the substrate 301. Accordingly, it can improve the electrical performance of the high-frequency device.

Take "two U-shape through-hole via inductors 250 which are all connected to the single capacitor 305 disposed on the bottom surface of the substrate 301" for example. The structure of the high-frequency device comprises: (a) a substrate having a first through-hole, a second through-hole, a third through-hole and a fourth through-hole therein; (b) a first U-shape through-hole via inductor comprising: a first through-hole via inductor, disposed in the first through-hole of the substrate; a second through-hole via inductor, disposed in the second through-hole of the substrate; and a first horizontal inductor disposed on the top surface of the substrate, wherein the first horizontal inductor has a first terminal and a second terminal, wherein the first terminal is electrical connected to the first through-hole via inductor, and the second terminal is electrical connected to the second through-hole via inductor; (c) a second U-shape through-hole via inductor comprising: a third through-hole via inductor, disposed in the third through-hole of the substrate; a fourth through-hole via inductor, disposed in the fourth through-hole of the substrate; and a second horizontal inductor disposed on the top surface of the substrate, wherein the second horizontal inductor has a third terminal and a fourth terminal, wherein the third terminal is electrical connected to the third through-hole via inductor, and the fourth terminal is electrical connected to the fourth through-hole via inductor; (d) a horizontal capacitor on the bottom surface of the substrate, wherein the first through-hole via inductor, the second through-hole via inductor, the third through-hole via inductor and the fourth through-hole via inductor are all electrically connected to the horizontal capacitor. In one embodiment, the first through-hole via inductor has a first integral body, the second through-hole via inductor has a second integral body, the third through-hole via inductor has a third integral body, and the fourth through-hole via inductor has a fourth integral body.

Figure 4B:
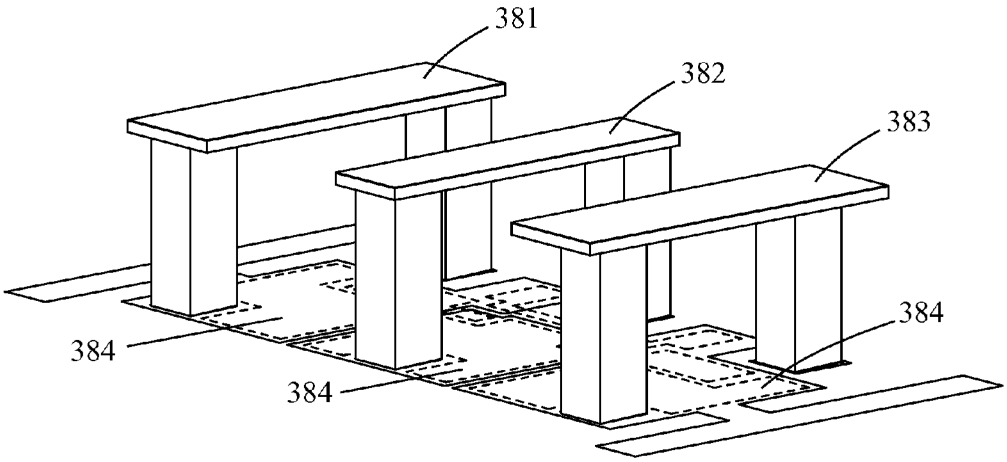
FIG. 4B and FIG. 4C illustrates a three-dimensional perspective view of the structure comprising a first U-shape through-hole via inductor, a second U-shape through-hole via inductor, a third U-shape through-hole via inductor and a pattern layout.
Figure 4C:
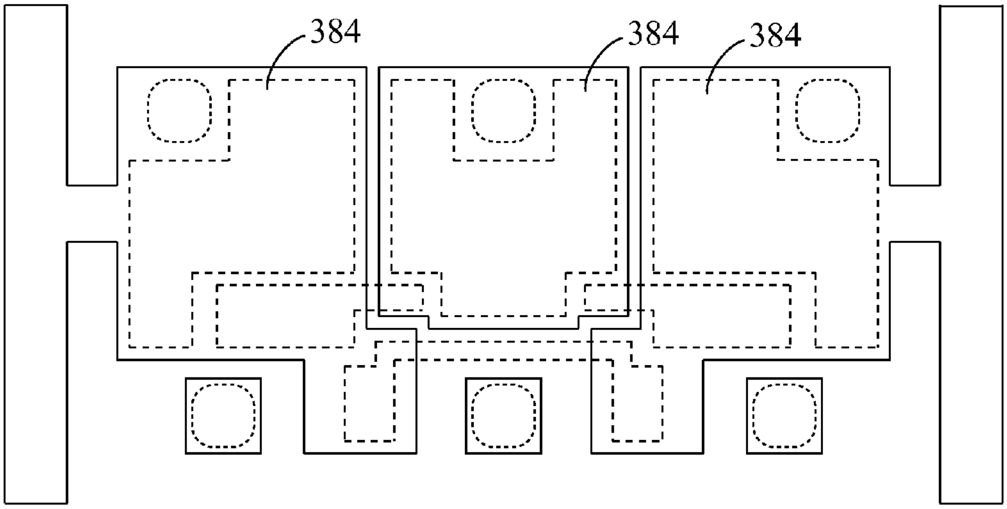

FIG. 4B and FIG. 4C illustrates a three-dimensional perspective view of the structure comprising a first U-shape through-hole via inductor 381, a second U-shape through-hole via inductor 382, a third U-shape through-hole via inductor 383 and a pattern layout 384. The first U-shape through-hole via inductor 381, the second U-shape through-hole via inductor 382, the third U-shape through-hole via inductor 383 are electrically connected to the pattern layout 384 therebelow. The pattern layout 384 can comprise at least one of an inductor, a capacitor or a ground terminal.

Figure 5A:
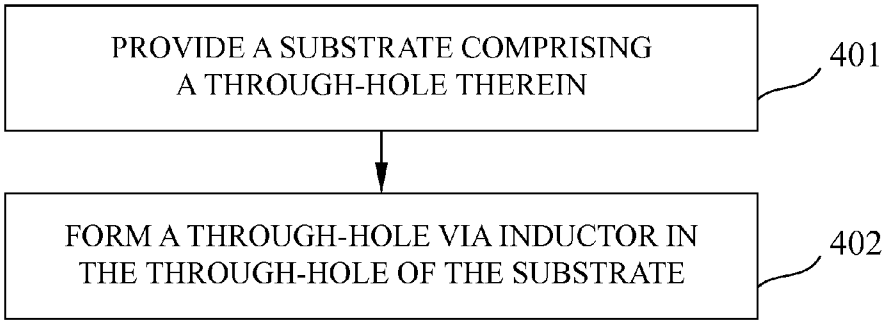
FIG. 5A illustrates the process flow of manufacturing the structure of the through-hole via inductor in FIG. 2A.

FIG. 5A illustrates the process flow of manufacturing the structure 100 of the through-hole via inductor 102 in FIG. 2A. The process flow comprises two main steps: provide a substrate comprising a through-hole therein (step 401); and form a through-hole via inductor in the through-hole of the substrate (step 402).

Figure 5B:
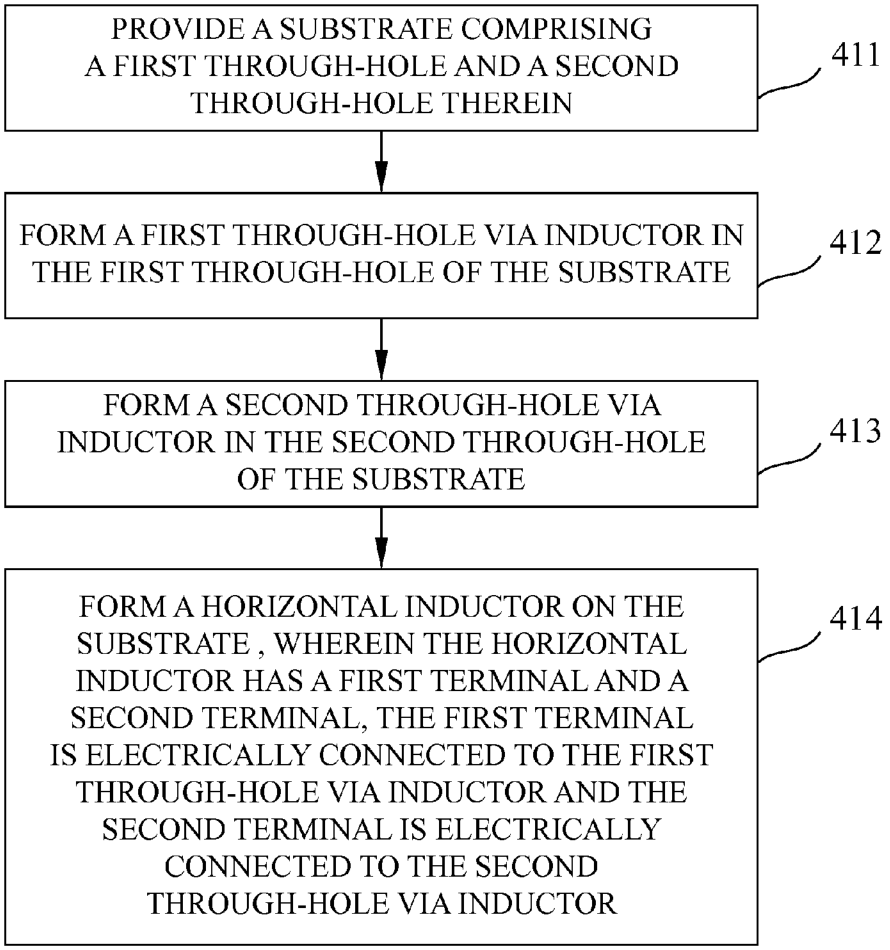
FIG. 5B illustrates the process flow of manufacturing the structure of the U-shape through-hole via inductor in FIG. 3A.

FIG. 5B illustrates the process flow of manufacturing the structure of the U-shape through-hole via inductor in FIG. 3A. The process flow comprises four main steps: provide a substrate comprising a first through-hole and a second through-hole therein (step 411); form a first through-hole via inductor in the first through-hole of the substrate (step 412);

form a second through-hole via inductor in the second through-hole of the substrate (step 413); and form a horizontal inductor on the substrate (step 414), wherein the horizontal inductor has a first terminal and a second terminal, the first terminal is electrically connected to the first through-hole via inductor and the second terminal is electrically connected to the second through-hole via inductor.

Figure 5C:
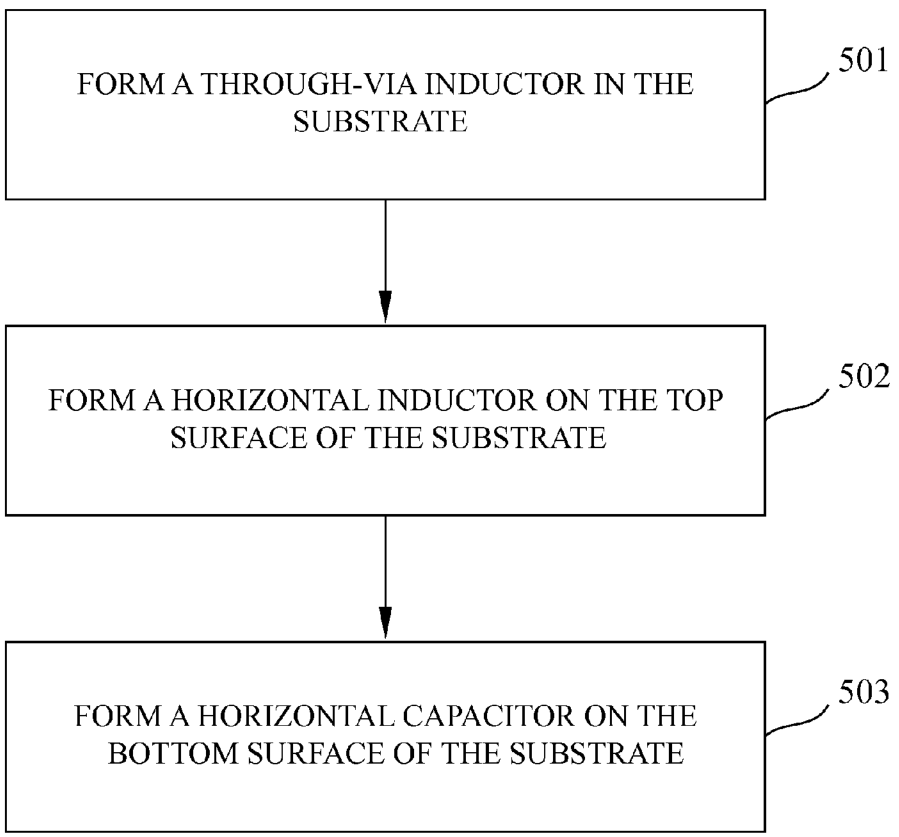
FIG. 5C illustrates the process flow of manufacturing the structure of the high-frequency device in FIG. 4A.

FIG. 5C illustrates the process flow of manufacturing the structure 300 of the high-frequency device in FIG. 4A. The process flow comprises three main steps: form a through-hole via inductor 302 in the substrate 301 (step 501); form a horizontal inductor 303 on the top surface of the substrate 301 (step 502); and form a horizontal capacitor 305 on the bottom surface of substrate 301 (step 503). The order of step 502 and step 503 can be changed. In one embodiment, the step 501 and step 502 can be combined in a single step "form an inductor 304 in the substrate 301" or "form a U-shape inductor 250 in the substrate 301"

Embodiment 1 for the process flow of manufacturing the structure 300 of the high-frequency device in FIG. 4A FIG. 6A to FIG. 6J illustrates the process flow of manufacturing the structure 300 of the high-frequency device in FIG. 4A.

The present invention disclose a method for manufacturing the structure 300 of the high-frequency device, wherein the method mainly includes via-drilling and via-filling in the substrate, and lithography process on the substrate.

Figure 6A:
FIG. 6A to FIG. 6J illustrates the process flow of manufacturing the structure 300 of the high-frequency device in FIG. 4A in detail.
Figure 6B:
Figure 6C:
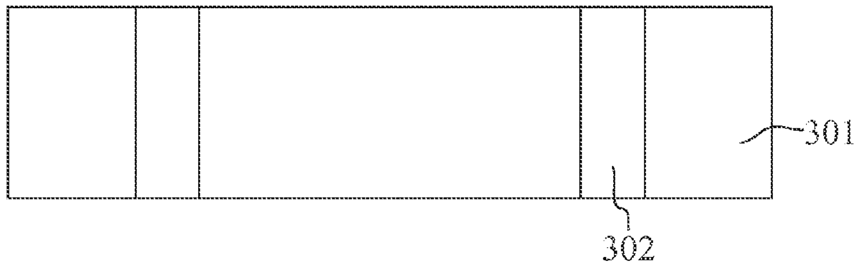

FIG. 6A to FIG. 6C describes the step 501: form a through-hole via inductor 302 in the substrate 301 in FIG. 5C As illustrated in FIG. 6A, provide a substrate 301. The substrate 301 has a top surface and a bottom surface. The substrate 301 can be made of any suitable material, such as a dielectric substrate or a ceramic substrate (e.g. aluminum-oxide ($Al_2O_3$) substrate). Before forming a through-hole via 311 in the substrate 301, the substrate 301 can be sintered. The thickness of the substrate 301 is 100~500 μm, preferably about 320 μm.

As illustrated in FIG. 6B, form a through-hole via 311 in the substrate 301. The through-hole via can be formed by known techniques, such as drilling, mechanical through-hole or laser through-hole.

As illustrated in FIG. 6C, fill a through-hole via 311 with a conductive material to form a through-hole via inductor 302. The through-hole via inductor 302 can be made of any suitable material, such as Cu, Ag or a combination thereof, to reduce its resistance. Preferably, the height of the through-hole via inductor 302 is about 320 μm and the width in diameter of the through-hole via inductor 302 is about 100 μm.

The through-hole via inductor 302 can comprise at least two materials which are well designed in the through-hole via inductor 302 to achieve the better electrical characteristics, wherein one of said at least two materials is a conductive material. In one embodiment, the through-hole via inductor 302 can be made of at least two conductive materials. Please refer back to FIG. 2C and FIG. 2D, the through-hole via inductor 302 can be made of a first conductive material overlaying the sidewall of the through-hole via and a second conductive material enclosed by the first conductive material. The first conductive material can overlay the sidewall of the through-hole via by electroplating or any suitable coating process. Preferably, the first conductive material can be made of Cu and the second conductive material can be made of Ag. In another embodiment, the through-hole via inductor 302 can comprise a conductive material and a non-conductive material enclosed by the conductive material. Accordingly, it can greatly improve the electrical performance of the high-frequency device.

Figure 6D:
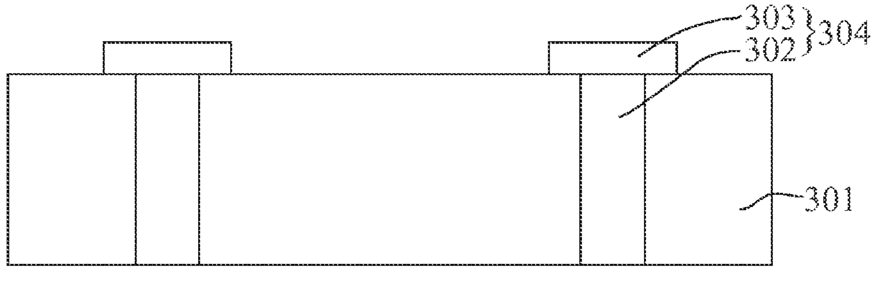

FIG. 6D describes the step 502 "form a horizontal inductor on the top surface of the substrate 301" in FIG. 5C in detail.

Figure 6E:
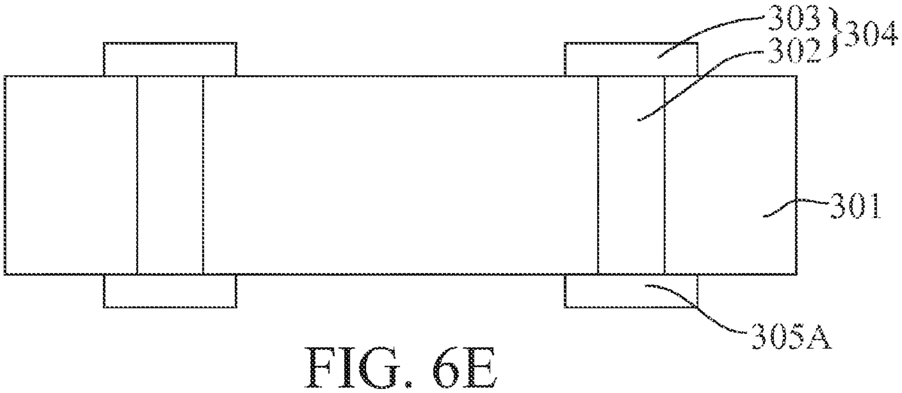
Figure 6F:
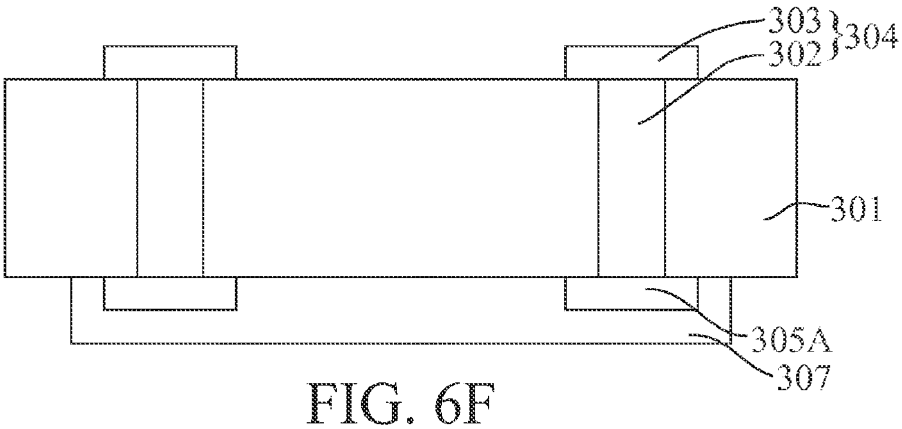
Figure 6G:
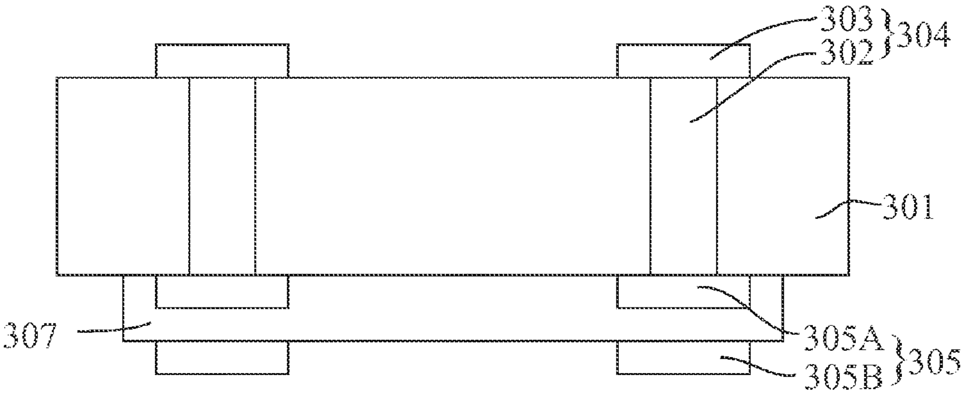

As illustrated in FIG. 6D, form a first patterned conductive layer 303 on the top surface of the substrate 301 to form a horizontal inductor 303. The horizontal inductor 303 is electrically connected to the through-hole via inductor 302. The first patterned conductive layer 303 can be patterned by lithography process or printing process. The first patterned conductive layer 303 can be made by any suitable material, such as Cu, Ag or a combination thereof, to reduce its resistance. In one embodiment, the step 501 and step 502 can be combined in a single step "form an inductor 304 in the substrate 301" or "form a U-shape inductor 250 in the substrate 301". FIG. 6E to FIG. 6G describes the step 503 "form a horizontal capacitor 305 on the bottom surface of the substrate 301" in FIG. 5C in detail.

As illustrated in FIG. 6E, form a second patterned conductive layer 305A on the bottom surface of the substrate 301. The second patterned conductive layer 305A can be patterned by lithography process or printing process. The second patterned conductive layer 305A can be made by any suitable material, such as Cu, Ag or a combination thereof.

As illustrated in FIG. 6F, form a dielectric layer 307 to overlay the second patterned conductive layer 305A. The dielectric layer 307 can be formed by chemical vapor deposition (CVD). The dielectric layer 307 can be made of any suitable material with high dielectric constant and high-quality factor.

As illustrated in FIG. 6G, form a third patterned conductive layer 305B on the dielectric layer 307 to form a horizontal capacitor 305 on the bottom surface of the substrate 301. The second patterned conductive layer 305A is used as one electrode of the horizontal capacitor 305; the second patterned conductive layer 305B is used as the other electrode of the horizontal capacitor 305; and the dielectric layer 307 is between two electrodes of the horizontal capacitor 305. The third patterned conductive layer 305B can be patterned by lithography process or printing process. The third patterned conductive layer 305B can be made by any suitable material, such as Cu, Ag or a combination thereof.

Figure 6H:
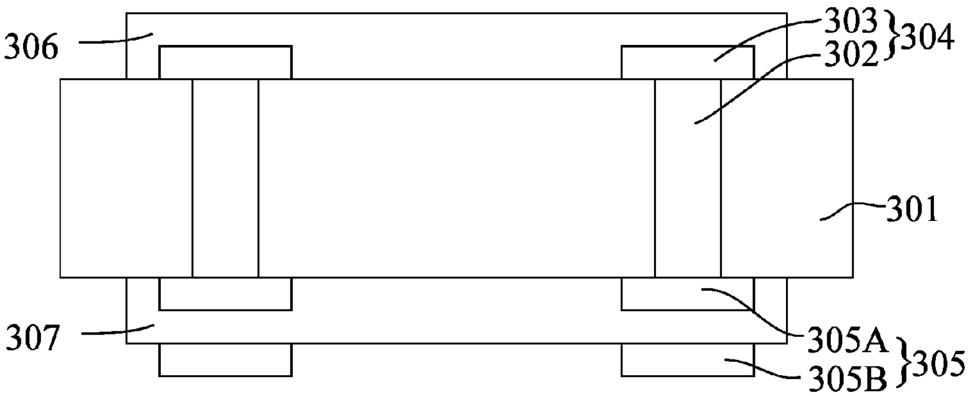

As illustrated in FIG. 6H, form a first passivation layer 306 to overlay the horizontal inductor 303. The first passivation layer 306 protects the horizontal inductor 303 from external interference.

Figure 6I:
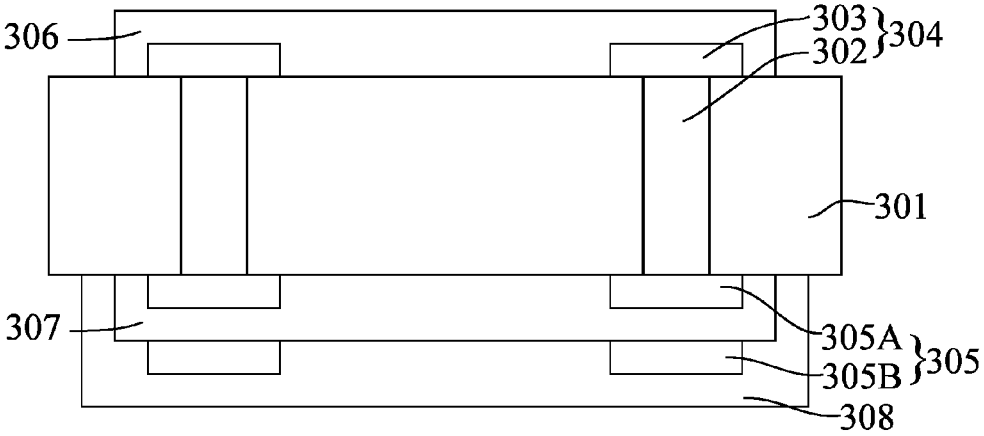

As illustrated in FIG. 6I, form a second passivation layer 308 to overlay the horizontal capacitor 305. The second passivation layer 308 protects the horizontal capacitor 305 from external interference.

Figure 6J:
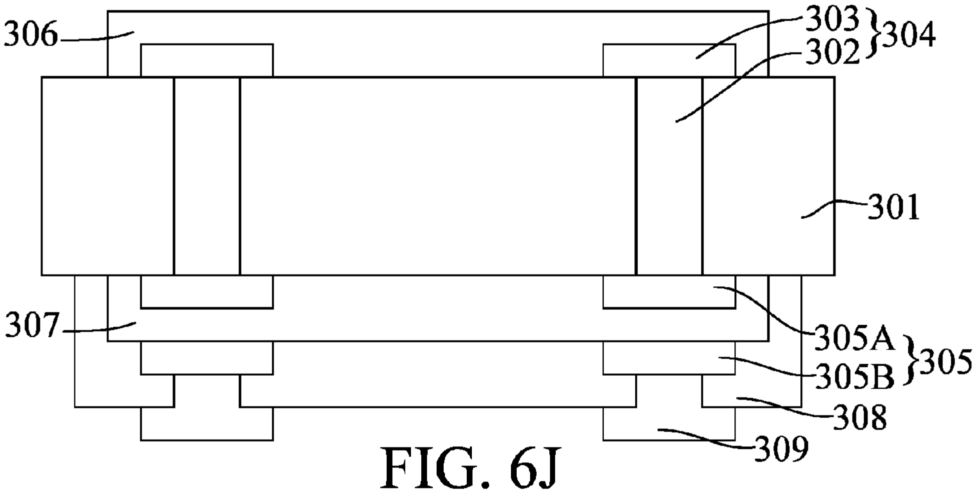

As illustrated in FIG. 6J, form a contact pad 309 on the second passivation layer 308 to electrically connect the horizontal capacitor 305. The contact pad 309 can be formed by lithography process or printing process.

Embodiment 2 for the process flow of manufacturing the structure 300 of the high-frequency device in FIG. 4A.

Please refer back to FIG. 5C. The present invention discloses another method for manufacturing the structure 300 of the high-frequency device, wherein the method mainly includes a multi-sheet substrate and lithography process on the multi-sheet substrate.

The process flow comprises three main steps: form a vertical inductor 302 in the substrate 301 (step 501); form a horizontal inductor 303 on the top surface of the substrate 301 (step 502); and form a horizontal capacitor 305 on the bottom surface of the substrate 301 (step 503). The order of step 502 and step 503 can be changed. In one embodiment, the step 501 and step 502 can be combined in a single step "forms an inductor 304 in the substrate 301" or "form a U-shape inductor 250 in the substrate 301".

In step 501, form a vertical inductor 302 in the substrate 301. A sheet is formed by green of the ceramic material or green of the polymer material. The thickness of the ceramic material or the polymer material can be 50~500 μm thick. Then, form a through-via in the sheet by known techniques, such as drilling, mechanical through-hole or laser through-hole, and fill the through-via in the sheet with a conductive material. So a sheet with of thickness of 150~400 μm is formed. A plurality of sheets can be stacked to form a substrate 301 by known process, such as LTCC (low-temperature co-fired ceramics). Then, perform sintering or curing to form a vertical inductor 302 in the substrate 301.

In step 502, form a horizontal inductor 303 on the top surface of the substrate 301. The horizontal inductor 303 be patterned by lithography process or printing process.

In step 503, form a horizontal capacitor 305 on the bottom surface of the substrate 301. The horizontal capacitor 305 is made by the combination of the electrodes and the dielectric layer which has a high dielectric constant and high-quality green. The green can be the mixture of the microwave-dielectric ceramic powders and an organic carrier. The organic carrier can be thermoplastic polymer, thermosetting polymer, plasticizer and organic solvent etc.

The steps of forming the green comprises mixing the microwave-dielectric ceramic powder with the organic vehicle and adjusting the mixture until the mixture has a suitable viscosity, degas, remove bubble, and tape casting. The green is adhered on the substrate 301 having the vertical inductor 302 by pressing. After curing, form a horizontal capacitor 305 on the bottom surface of the substrate 301.

The steps or characteristics of FIG. 6H to FIG. 6J described in embodiment 1 can be applied to this embodiment 2 as well; therefore the details are not described herein.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A high-frequency device, comprising:

a substrate, comprising a first through-hole therein;

a horizontal inductor having a first inductance, disposed on the substrate; and a first through-hole via inductor having a second inductance, disposed in the first through-hole of the substrate, wherein the first through-hole via inductor is formed by disposing a conductive pillar structure in the first through-hole of the substrate, wherein the top surface of the conductive pillar structure forms a first terminal of the first through-hole via inductor and the bottom surface of the conductive pillar structure forms a second terminal of the first through-hole via inductor, wherein the first through-hole via inductor is not a part of a spiral coil and one of the terminals of first through-hole via inductor is electrically connected to the horizontal inductor, wherein the second inductance of the first through-hole via inductor is greater than the first inductance of the horizontal inductor.

2. The high-frequency device according to claim 1, wherein the high-frequency device is operated at not less than 1 GHz.

3. The high-frequency device according to claim 2, wherein the high-frequency device is operated substantially at 2.4 GHz.

4. The high-frequency device according to claim 1, wherein the resultant inductance of the first through-hole via inductor and the horizontal inductor is substantially equal to the inductance of the first through-hole via inductor.

5. The high-frequency device according to claim 1, wherein the first through-hole via inductor comprises at least two materials, wherein one of said at least two materials is a conductive material, said conductive material overlaying on the sidewall of the first through-hole via of the substrate.

6. The high-frequency device according to claim 1, wherein the conductive pillar structure comprises:

a first conductive material overlaying on the sidewall of the first through-hole via of the substrate; and a second conductive material enclosed by the first conductive material.

7. The high-frequency device according to claim 1, wherein the conductive pillar structure comprises a conductive material and a non-conductive material enclosed by the conductive material, the conductive material overlaying on the sidewall of the first through-hole via of the substrate.

8. The high-frequency device according to claim 1, wherein the first through-hole via inductor is disposed on the top surface of the substrate, further comprising a horizontal capacitor disposed on the bottom surface of the substrate, wherein the first terminal is electrically connected to the horizontal inductor and the second terminal is electrically connected to the horizontal capacitor.

9. The high-frequency device according to claim 1, wherein the substrate further comprises a second through-hole therein, and the horizontal inductor is disposed on the top surface of the substrate, further comprising: a second through-hole via inductor, disposed in the second through-hole of the substrate, wherein the horizontal inductor comprises a first terminal and a second terminal, wherein the first terminal is electrically connected to the first through-hole via inductor and the second terminal is electrically connected to the second through-hole via inductor.

10. The high-frequency device according to claim 9, wherein the resultant inductance of the first through-hole via inductor and the second through-hole via inductor is greater than the inductance of the horizontal inductor.

11. The high-frequency device according to claim 9, wherein each of the first through-hole via inductor and the second through-hole via inductor comprises:

a first conductive material overlaying the sidewall of said each of the first through-hole and the second through-hole; and a second conductive material enclosed by the first conductive material.

12. The high-frequency device according to claim 9, wherein each of the first through-hole via inductor and the second through-hole via inductor comprises a conductive material and a non-conductive material enclosed by the conductive material.

13. The high-frequency device according to claim 9, further comprising a horizontal capacitor on the bottom surface of the substrate, wherein at least one of the first through-hole via inductor and the second through-hole via inductor is electrically connected to the horizontal capacitor.

14. A high-frequency device, comprising:

a substrate having a first through-hole, a second through-hole, a third through-hole and a fourth through-hole therein;

a first U-shape through-hole via inductor, comprising:

a first through-hole via inductor having a first inductance, wherein the first through-hole via inductor is formed by disposing a first conductive pillar structure in the first through-hole of the substrate;

a second through-hole via inductor having a second inductance, wherein the second through-hole via inductor is formed by disposing a second conductive pillar structure in the second through-hole of the substrate; and a first horizontal inductor having a third inductance, disposed on the top surface of the substrate, wherein the first horizontal inductor has a first terminal and a second terminal, wherein the first terminal is electrically connected to the first through-hole via inductor, and the second terminal is electrically connected to the second through-hole via inductor, wherein the sum of the first inductance and the second inductance is greater than the third inductance; and a second U-shape through-hole via inductor, comprising:

a third through-hole via inductor having a fourth inductance, wherein the third through-hole via inductor is formed by disposing a third conductive pillar structure in the third through-hole of the substrate;

a fourth through-hole via inductor having a fifth inductance, wherein the fourth through-hole via inductor is formed by disposing a fourth conductive pillar structure in the fourth through-hole of the substrate; and a second horizontal inductor having a sixth inductance, disposed on the top surface of the substrate, wherein the second horizontal inductor has a third terminal and a fourth terminal, wherein the third terminal is electrically connected to the third through-hole via inductor, and the fourth terminal is electrically connected to the fourth through-hole via inductor, wherein the sum of the fourth inductance and the fifth inductance is greater than the sixth inductance;

wherein each of the first U-shape through-hole via inductor and the second U-shape through-hole via inductor is not a part of a spiral coil.

15. The high-frequency device according to claim 14, further comprising a horizontal capacitor on the bottom surface of the substrate, wherein the first through-hole via inductor, the second through-hole via inductor, the third through-hole via inductor and the fourth through-hole via inductor are electrically connected to the horizontal capacitor.

16. The high-frequency device according to claim 1, wherein the substrate is a ceramic substrate.

17. The high-frequency device according to claim 1, wherein the first through-hole via inductor has an integral body.

18. The high-frequency device according to claim 1, further comprising a capacitor formed on the bottom surface of the substrate, wherein the capacitor has a first electrode layer and a second electrode layer, wherein a dielectric layer is disposed between the first electrode layer and the second electrode layer, wherein the first electrode layer of the capacitor overlays on the bottom surface of the conductive pillar structure of the first through-hole via inductor, and the dielectric layer and the second electrode layer are disposed under the bottom surface of the substrate.

19. A high-frequency device, comprising:

a substrate, comprising a first through-hole therein;

a first through-hole via inductor, wherein the first through-hole via inductor is formed by disposing a conductive pillar structure in the first through-hole of the substrate, wherein the top surface of the conductive pillar structure forms a first terminal of the first through-hole via inductor and the bottom surface of the conductive pillar structure forms a second terminal of the first through-hole via inductor, wherein the first through-hole via inductor is not a part of a spiral coil.

20. The high-frequency device according to claim 19, further comprising a capacitor formed on the bottom surface of the substrate, wherein the capacitor has a first electrode layer and a second electrode layer, wherein a dielectric layer is disposed between the first electrode layer and the second electrode layer, wherein the first electrode layer of the capacitor overlays on the bottom surface of the conductive pillar structure of the first through-hole via inductor, and the dielectric layer and the second electrode layer are disposed under the bottom surface of the substrate.

* * * * *